United States Patent [19]

Dantilatos

[11] Patent Number: 4,596,928
[45] Date of Patent: Jun. 24, 1986

[54] METHOD AND APPARATUS FOR AN ATMOSPHERIC SCANNING ELECTRON MICROSCOPE

[75] Inventor: Gerasimos D. Dantilatos, North Bondi, Australia

[73] Assignee: Unisearch Limited, Kensington, Australia

[21] Appl. No.: 609,654

[22] Filed: May 14, 1984

Related U.S. Application Data

[63] Continuation of Ser. No. 162,838, Jun. 25, 1980, abandoned.

[30] Foreign Application Priority Data

Jul. 3, 1979 [AU] Australia ............................... PD9433

[51] Int. Cl.$^4$ .............................................. G01N 23/00
[52] U.S. Cl. ....................................... 250/307; 250/310
[58] Field of Search ................. 250/310, 311, 306, 307

[56] References Cited

U.S. PATENT DOCUMENTS

| Re. 27,005 | 12/1970 | Wingfield et al. | 250/310 |
|---|---|---|---|
| 3,222,496 | 12/1965 | Windebank | 250/396 |
| 3,346,736 | 10/1967 | Neuhaus | 250/310 |
| 3,626,184 | 12/1971 | Crewe | 250/310 |
| 3,629,579 | 12/1971 | Naltou | 250/310 |
| 4,177,379 | 12/1979 | Furukawa | 250/310 |

OTHER PUBLICATIONS

"The Environmental Control Stage", Lane, *Scanning Electron Microscopy,* IITRI, Chicago, pp. 43-48 (1970).
"The SEM Examination of Wet Specimens", Robinson, *Scanning,* vol. 1, pp. 149-156 (1978).

*Primary Examiner*—Bruce C. Anderson
*Attorney, Agent, or Firm*—Holman & Stern

[57] ABSTRACT

A new detection configuration devised for the Scanning Electron Microscope (SEM), which allows the imaging of the surfaces of a specimen at atmospheric pressure. Such a detection configuration gives rise to a new microscope: the Atmospheric Scanning Electron Microscope (ASEM). In this configuration the detector means, such as a backscattered electron detector, is placed between the pressure limiting aperture and the electron column. The electron beam passes through the final aperture, reaches the sample under atmospheric conditions and the backscattered electrons (or other signals) are allowed to reach the detector. The new configuration makes it possible for specimens or materials to be viewed in an open room. Examination of materials, not only in their natural state but also in their natural position, is possible. This feature of the ASEM will be extremely useful in areas where sampling is impossible, expensive or critical for the test subject, e.g. skin, live tissue, archaelogical findings, machine components and aircraft wings. The ASEM can also be made to function at the full pressure range between 0-1 atmospheres.

9 Claims, 1 Drawing Figure

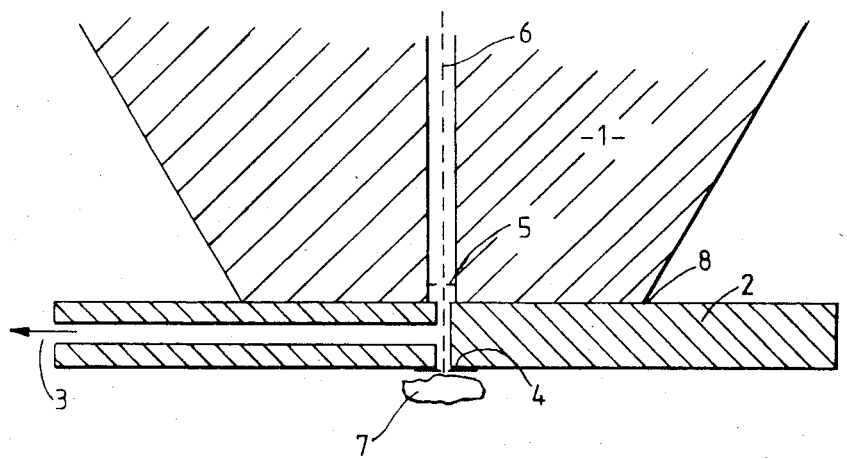

METHOD AND APPARATUS FOR AN ATMOSPHERIC SCANNING ELECTRON MICROSCOPE

This is a continuation of application Ser. No. 162,838 filed June 25, 1980 abandoned.

The present invention relates to a scanning electron microscope (SEM) suitable for operation at normal atmospheric pressures.

The scanning electron microscope (SEM) and the electron probe microanalyzer (EPMA) are instruments which permit the characterization of materials and surface, and the observation of phenomena on a fine scale. The SEM and EPMA are, in reality, one and the same instrument and can be treated as such. As used herein, only the term SEM will be used; this term will imply what the broad scientific community has defined as a scanning electron microscope which includes the EPMA or other terms which can be used in particular applications of the SEM.

The hitherto developed SEM does not allow the examination of objects at atmospheric pressure, thus eliminating the possibility of looking at specimens in their natural environment.

It is an object of the present invention to provide a modified SEM which will be a useful aid at normal atmospheric pressures, eliminating the need for a vacuum specimen chamber required by a SEM. The modified SEM would also be useful for examination of objects at pressures in the full range between 0-1 atm.

It is a further object of this invention to provide a modified SEM which eliminates the need for sample preparation.

It is yet another object of this invention to provide a modified SEM, to be referred to as an Atmospheric Scanning Electron Microscope (ASEM), which is portable, and which can be brought to the specimen, and which would allow the examination of living specimens and/or specimens in their natural environment or position.

BRIEF DESCRIPTION OF THE DRAWINGS

These and further objects of the invention will be apparent from the following description of the invention as illustrated in the accompanying drawing wherein the single FIGURE is a general schematic diagram for an Atmospheric Scanning Electron MIcroscope operating in a backscattered electron detection mode.

Whenever the new detection configuration of the present invention is used with any past, present or future form of SEM, it will herein be considered as an ASEM.

In one aspect the present invention provides a new detection configuration for a SEM wherein a detector is placed between a final pressure limiting aperture and the objective aperture of the electron column of the electron microscope. The object to be examined is placed below the pressure limiting aperture. The geometry of the detector allows the electron beam to reach the object through the pressure limiting aperture. The signal to be detected passes through the pressure limiting aperture and strikes the detector.

The pressure limiting aperture can be part of the detecting system. Thus, the detection of a signal can take place partly or wholly inside or around the lower side of the aperture facing the object under examination. For example, this aperture can be made in scintillator material or developed in a solid state detector, thus being incorporated in the detector.

Various signals can be detected such as backscattered electrons, X-rays, Auger electrons, cathodoluminescence and others which can reach the detector in the present configuration.

Various types of detector corresponding to various types of signals can be used. For example, scintillator or solid state material can be used for the detection of backscattered electrons.

The preferred backscattered electron detector is constructed from scintillator material, but any other type of backscattered electron detector which is not affected by the presence of high pressure gas, could be used.

The detector fits at the bottom of the column so that air leakage into the column can only take place through the aperture.

The pressure limiting aperture serves a dual purpose:
(a) it allows the signal to be detected to reach the detector
(b) it reduces the high atmospheric pressure prevailing below it to a very low level of pressure above it.

The shape and size of the pressure limiting aperture, as well as the shape and material from which this aperture is made, can vary provided it satisfies its dual purpose. For example, the aperture can be circular or square in the plane perpendicular to its axis and conical or cylindrical along the direction of its axis. When a relatively thick aperture grid is used, the aperture must have a shape of a truncated cone with its large diameter facing upwards, so that an efficient signal can reach the detector. When a relatively thin aperture grid is used or alternatively, a relativey large aperture is used, then the shape of a truncated cone is not necessary. In forms of the invention incorporating a backscattered electron detector, this is desirable in order to achieve a sufficiently wide collection angle for the backscattered electrons.

The material from which the pressure limiting aperture is made can vary in order to make the aperture more durable, re-usable, or easy to replace.

A combination of materials can be used to give the pressure limiting aperture certain advantages. For example, the inside rim of the aperture facing upwards can be coated with a low atomic number material (e.g. carbon) so that the contrast due to the appearance of the rim on the micrographs at low magnification is eliminated. Coating of the outside surface of the aperture with a thin layer of scintillating material may also contribute to the detection signal.

The limits and the correct choice of the size of both the pressure limiting aperture and the objective aperture depend on the given vacuum pumping system of the ASEM. In principle, and in practice, the ASEM can operate provided that the electron optics column—together with the new detection configuration of the ASEM—are made leak-proof, except that the only leak allowed into the column is that which occurs through the pressure limiting aperture.

Modifications of the vacuum pumping system of the ASEM are important in improving its effectivness. Such modifications do not depart from the spirit or scope of the invention. In fact, such an important modification of the vacuum pumping system of the available SEM, type JEOL-JSM-2, was effected in building a prototype ASEM. This modification consists of introducing a direct vacuum pumping bore hole between the pressure limiting aperture and the objective aperture, with remarkable results. Under these conditions of pumping, only a very small fraction of gas leaks into the column, while most of the gas passing through the pressure limiting aperture is pumped away.

The sizes and shapes of the pressure limiting aperture and the objective aperture, the distance between these two apertures, the magnitude of the conductances along the pumping paths and the pumping speed of the pumps used can be optimized to achieve a minimum of electron beam scattering while the beam travels between the objective and pressure limiting apertures.

The ASEM can be manufactured to have a portable column. This enables the ASEM to be used for the examination of objects in their natural place and state under ambient conditions of pressure and temperature.

The requirement for the examination of any surface is that this surface is brought in close proximity to the pressure limiting aperture at a distance of the order of magnitude of the pressure limiting aperture.

The conventional specimen chamber of a SEM is not required for an ASEM operating at atmospheric pressure. A specimen chamber can be made as an accessory of the ASEM for work at pressure lower than atmospheric. Thus the ASEM can function at the full pressure range between 0-1 atm.

The same detection configuration can be used for work at lower than atmospheric pressure. Though versatility of the ASEM detection configuration is increased by allowing the signal to be detected also from the side of the pressure limiting aperture facing the sample. This allows the sample to be moved further away from the pressure limiting aperture as the pressure decreases in the specimen chamber. The ASEM can thus be made to operate at atmospheric pressure, or at intermediate pressures as an environmental scanning electron microscope (ESEM), or at high vacuum (SEM).

The field of view of the ASEM is limited to some extent at low magnifications. For example, when a pressure limiting aperture of 50 $\mu$m is used, the field of view becomes restricted at magnifications 1000× or lower. To achieve the full scope of the ASEM, a new instrument must be designed and constructed at the manufacture level. The principle of the ASEM can also be manufactured as an accessory unit for the conversion of the existing SEM's to ASEM's. These accessories will be only of limited scope in comparison with a newly built portable ASEM.

The invention will be further described with reference to the accompanying drawing, which is a general schematic diagram for an ASEM operating in the backscattered electron detection mode. In the drawing the pole piece 1 of the electron column of the electron microscope firmly abuts, as at 9, against the scintillator backscattered electron detector 2 such that there is no air-space inbetween. The detector is aligned with the pole piece such that the objective aperture 5 is coaxial with the pressure limiting aperture 4. The specimen or sample 7 to be examined is placed immediately below the pressure limiting aperture, in line with the electron beam 6. The detector may include a bore hole for attachment to pumping means, as at 3, for evacuation of the space between the pressure limiting aperture and the objective aperture.

The basic principle of this ASEM is that the detector is placed between the apertures 4 and 5 and the sample 7 is placed below the aperture 4. In the case where a backscattered electron detector is employed, the electron beam—after passing the final aperture 4—strikes the sample 7 and the backscattered electrons are allowed to re-enter the final aperture 4 and strike the detector 2. The introduction of pumping at 3 between the apertures 4 and 5 evacuates the space therebetween and permits the use of larger final apertures 4.

The main advantage of the ASEM system is that it allows materials or specimens to be viewed at atmospheric pressure or in an open room, e.g. studies of fatigue of metals in situ can be realized. Examination of materials, not only in their natural state but also in their natural position, can also be realized. This is achieved by constructing a portable electron column. This feature of the ASEM will prove to be extremely useful in areas where sampling is impossible, expensive or critical for the test subject (skin, live tissue, archaeological findings, machine components, aircraft wings, etc.).

In conclusion, the ASEM constitutes a breakthrough in microscopy because it possesses most of the advantages of both the light microscope and the SEM in a unique combination, creating a completely new field of applications.

Although the invention has been described above with reference to preferred embodiments and drawings, it will be appreciated that numerous variations, modifications or alternatives may be substituted for specifically described features, without departing from the spirit or scope of the invention as broadly described.

I claim:

1. In a scanning electron microscope of the type in which an electron beam is established in a high vacuum environment and is directed in a downstream direction to a pressure limiting objective aperture to impinge upon a sample, and in which a detector is disposed to detect emissions from the sample resulting from impingement of the bem of the sample, an improvement comprising:

aperture defining means defining a final pressure limiting aperture for passing said electron beam, as received from said objective aperture, to said sample, said final pressure limiting aperture being located downstream of said objective aperture to define a space between the two apertures, said final pressure limiting aperture being open to an ambient gas environment downstream of said final pressure limiting aperture, said aperture defining means having a downstream facing surface, facing said sample;

evacuation means for continuously drawing said ambient gas from said ambient gas environment through said final pressure limiting aperture and into said space, said evacuation means including means for evacuating gas from said space; and wherein said detector is disposed downstream of said objective aperture and no further downstream than abutting said downstream facing surface.

2. The scanning electron microscope according to claim 1 wherein said final aperture has a predetermined dimension transverse to said beam, and wherein said sample is disposed at a distance from said final aperture on the order of magnitude of said predetermined dimension.

3. The scanning electron microscope according to claim 1 wherein said aperture defining means is integral with said detector.

4. The scanning electron microscope according to claim 1 wherein said detector is contiguous with said final aperture.

5. The scanning electron microscope according to claim 1 wherein said detector is a backscattered electron detector for detecting electrons which are backscattered from said sample in response to said beam impinging on said sample.

6. The method of viewing a sample with a scanning electron microscope comprising the steps of:

passing an electron beam through a pressure limiting objective aperture, a space, and a final pressure limiting aperture to impinge upon said sample at a location downstream of said final pressure limiting aperture, said space being defined between said apertures;

continuously flowing gas from downstream of said final aperture into said space through said final aperture in a direction opposite the direction of said beam;

continuously evacuating gas from said space; and detecting emissions from said sample, resulting from said beam impinging upon said sample, at a location downstream of said objective aperture and no further downstream than abutting a downstream facing surface of a structure in which said final aperture is defined.

7. The method according to claim 6 wherein the gas downstream of said final aperture surrounds said sample and has a permissible range of pressures between 0 and 1 atmosphere.

8. The method according to claim 6 wherein the step of detecting includes detecting emissions at a location contiguous with said structure in which said final aperture is defined.

9. The method according to claim 6 wherein said sample is disposed in a specimen chamber supplied with said gas and maintained at a pressure below atmospheric pressure.

* * * * *